(12) United States Patent
Chang

(10) Patent No.: US 6,638,822 B2
(45) Date of Patent: Oct. 28, 2003

(54) METHOD FOR FORMING THE SELF-ALIGNED BURIED N+ TYPE TO DIFFUSION PROCESS IN ETOX FLASH CELL

(75) Inventor: Cheng-Jyi Chang, Tai-Chung (TW)

(73) Assignee: United Microelectronics Corp., Hsin-chu (TW)

( * ) Notice: Subject to any disclaimer, the term of this patent is extended or adjusted under 35 U.S.C. 154(b) by 50 days.

(21) Appl. No.: 10/092,998

(22) Filed: Mar. 6, 2002

(65) Prior Publication Data

US 2003/0170953 A1 Sep. 11, 2003

(51) Int. Cl.[7] ............................................. H01L 29/72
(52) U.S. Cl. ........................................ 438/257; 438/264
(58) Field of Search ................................. 438/257, 262, 438/264, 266, 197, 296, 303, 524, 587, 589, 700; 257/321, 506, 510, 519

(56) References Cited

U.S. PATENT DOCUMENTS 6,037,221 A * 3/2000 Lee et al. .................... 438/257
6,127,226 A * 10/2000 Lin et al. .................... 438/259
6,372,564 B1 * 4/2002 Lee ............................. 438/192

* cited by examiner

Primary Examiner—David Nelms
Assistant Examiner—David Vu
(74) Attorney, Agent, or Firm—Merchant & Gould P.C.

(57) ABSTRACT

A method for forming the self-aligned buried N+-type to diffusion process in ETOX flash cell is disclosed. The method at least includes the following steps. First of all, a substrate is provided having a pad oxide layer thereon, a dielectric layer on the pad oxide layer, and a cap layer on the dielectric layer. Then, a portion of the cap layer and the dielectric layer are etched to stop on the pad oxide layer to define an active region. Then, a spacer is formed on sidewall of the dielectric layer. Next, a portion of the pad oxide layer and the substrate are etched through said buried N+-type region to form an opening in the substrate. Finally, a field oxide region is formed in the substrate.

17 Claims, 5 Drawing Sheets

METHOD FOR FORMING THE SELF-ALIGNED BURIED N+ TYPE TO DIFFUSION PROCESS IN ETOX FLASH CELL

BACKGROUND OF THE INVENTION

1. Field of the Invention

The present invention generally relates to a non-volatile memory, and more particularly to a method for forming the self-aligned buried $N^+$ type to diffusion process in ETOX flash cell.

2. Description of the Prior Art

Flash memory is the most potential memory in the semiconductor industry. Flash memory has been broadly applied to repeatedly access data and to remain assessable during power break down, such as the film of digital camera or the basic input-output system of a motherboard. Because flash memory has the advantages of electrically erasable and programmable, it can simultaneously proceed the erase and the program mechanisms to all flash memory cells in the whole memory array. Accordingly, how to advance the performance and reduce the cost of the flash memory became an important subject.

High-density flash memories have been developed as file memories in portable equipment such as hand-held computer and digital still cameras. One of the most important issues for the memory is low bit cost by reducing cell size. To reduce the cell size, the data line pitch as well as the gate length must be reduced. We have report $0.4 \, \mu m^2$ contactless-array memory cells, with 3 feature size data-line pitch, using self-aligned isolation. However, the smaller data-line pitch causes a higher internal operating voltage because the coupling ratio decreases due to the decrease in the surface area of floating gates. Therefor, the isolation breakdown voltage should be maintained even through the isolation region is reduced. Moreover, a cell with a high coupling ratio resulting from increasing inter-poly capacitance is necessary to reduce the operating voltage.

Referring to FIG. 1A, a substrate 100 is provided, and the substrate 100 comprises silicon. Then, a pad oxide layer 102 is formed on the substrate 100. The pad oxide 102 is formed by using a thermal oxide method. Next, a dielectric layer 104 is formed on the pad oxide layer 102. The dielectric layer 104 comprises silicon nitride. The dielectric layer 104 is formed by using a chemical vapor deposition method. Then, a portion of the dielectric layer 104, pad oxide layer 102 and the substrate 100 are etched to form a shallow trench isolation openings 105 in the substrate 100.

Referring to FIG. 1B, a silicon oxide is filled up the shallow trench isolation openings 105. Next, the shallow trench isolation openings 105 are planarized to form a shallow trench isolation 106 by using a chemical mechanical polishing method. Then, the dielectric layer 104 is removed on the pad oxide layer 102.

Referring to FIG. 1C, a diffusion pattern mask 109 is formed pad oxide layer 102. Then, the burried $N^+$-type ions are implanted 10 into the substrate 100 to form a source/drain region 110. The source/drain region 110 is not symmetric cell. The non self-aligned method has a fatal drawback that alignment accuracy will affect cell symmetry and bit/source line resistance.

For the forgoing reasons, there is a necessity for a method for forming the self-aligned buried $N^+$-type to diffusion process in ETOX flash cell. This invention provided a method to fabricate symmetric cell and much stable bit/source line resistance.

SUMMARY OF THE INVENTION

In accordance with the present invention is provided to a method for forming the self-aligned buried $N^+$-type to diffusion process in ETOX flash cell to provide symmetric cell and much more sable bit/source line resistance.

One object of the present invention is to provide a method for forming the self-aligned buried $N^+$-type to diffusion process in ETOX flash cell and also to fabricate symmetric cell for ETOX flash cell operation.

Another object of the present invention is to provide a method for forming the self-aligned buried $N^+$ type to diffusion process in ETOX flash cell to stable bit/source line resistance.

In order to achieve the above objects, the present invention provides a method for forming the self-aligned buried $N^+$-type to diffusion process in ETOX flash cell. First of all, a substrate is provided having a pad oxide layer thereon, a dielectric layer on the pad oxide layer, and a cap layer on the dielectric layer. Then, a portion of the cap layer and the dielectric layer are etched to stop on the pad oxide layer to define an active region. Then, a spacer is formed on sidewall of the dielectric layer. Next, a portion of the pad oxide layer and the substrate are etched through said buried $N^+$-type region to form a opening in the substrate. Finally, a field oxide region is formed in the substrate.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarity of illustration and should not be interpreted in a limiting sense. Accordingly, these regions will have dimensions, including length, width and depth, when fabricated in an actual device.

The embodiment of the present invention is depicted in the FIGS. 2A–2G, which show a cross-section of the self-aligned BN+ to diffusion process in ETOX flash cell in accordance with preferred the present invention.

Figure 1A:
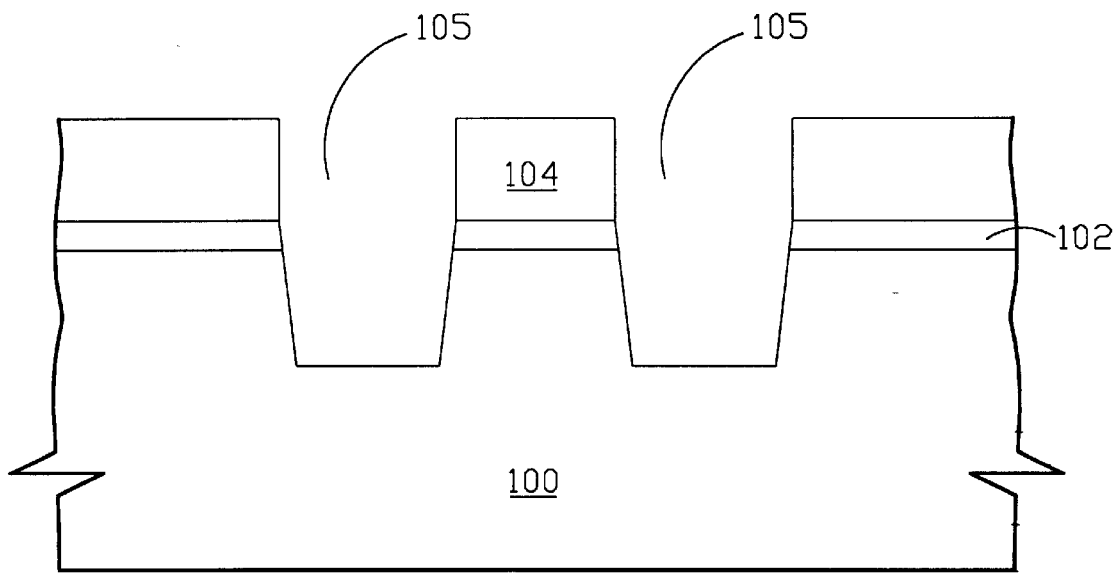
FIGS. 1A–1C are cross-sectional schematic diagrams illustrating the non self-aligned of ETOX flash cell array in the prior art.
Figure 1B:
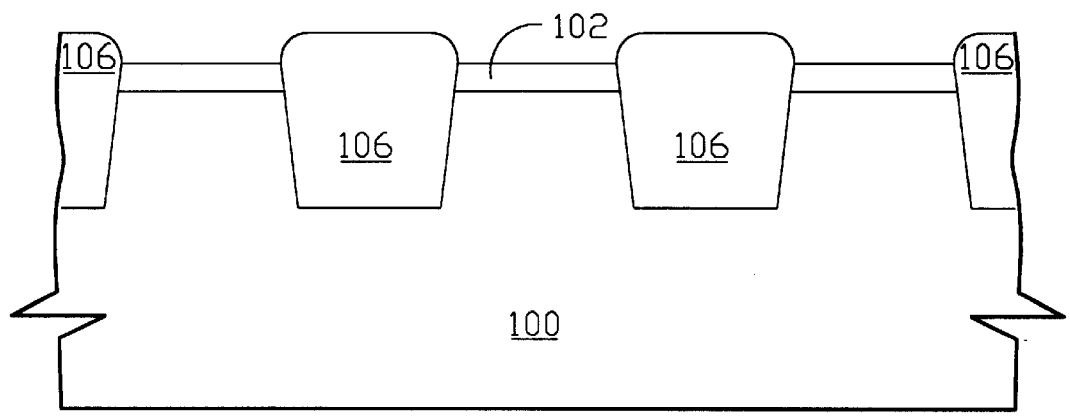
Figure 1C:
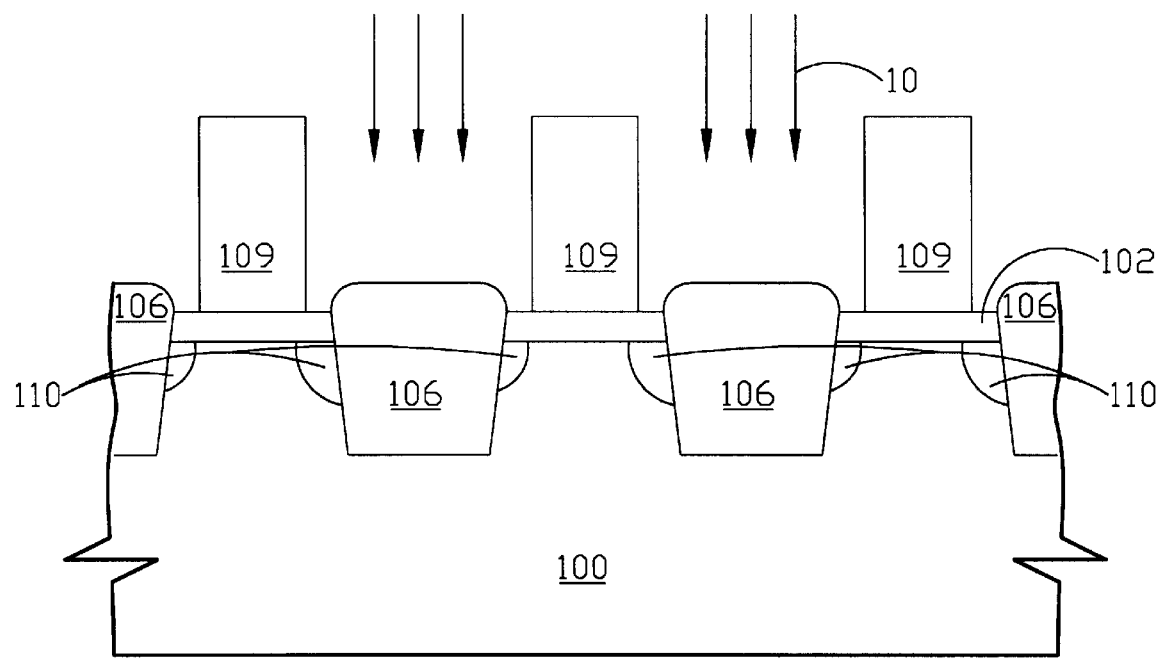
Figure 2A:
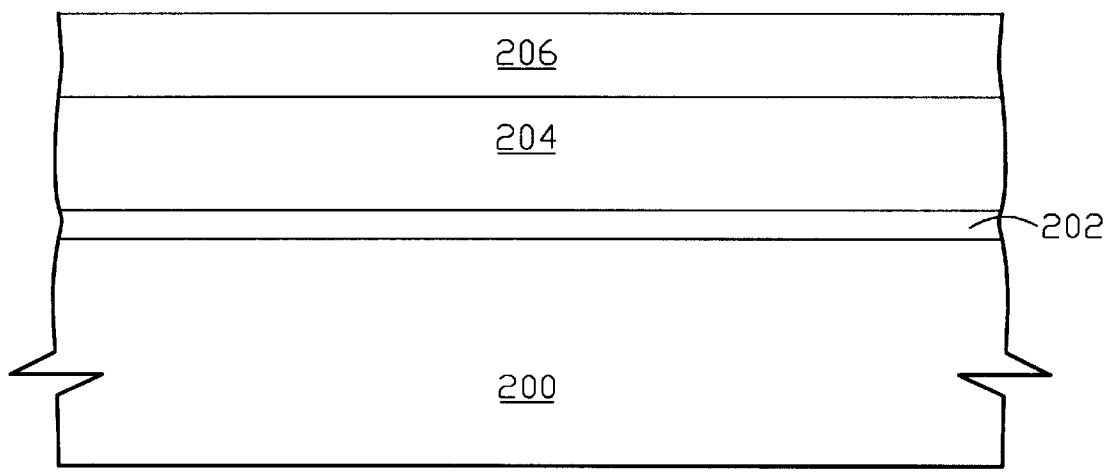
FIGS. 2A–2G are cross-sectional schematic diagrams illustrating the self-aligned buried $N^+$-type to diffusion process in ETOX flash cell in accordance with preferred the present invention.

Referring to FIG. 2A, the silicon substrate wafer 200 is oxidized in a furnace to grow a thin layer of silicon dioxide on the surface. The first silicon dioxide layer is known as the "pad" oxide 202. Next, a dielectric layer 204 is formed on the pad oxide layer 202. The dielectric layer 204 comprises silicon nitride. The dielectric layer 204 is formed by using a chemical vapor deposition method. Then, a cap layer 206 is formed on the dielectric layer 204. The cap layer 206 is formed by using a chemical vapor deposition method.

Figure 2B:
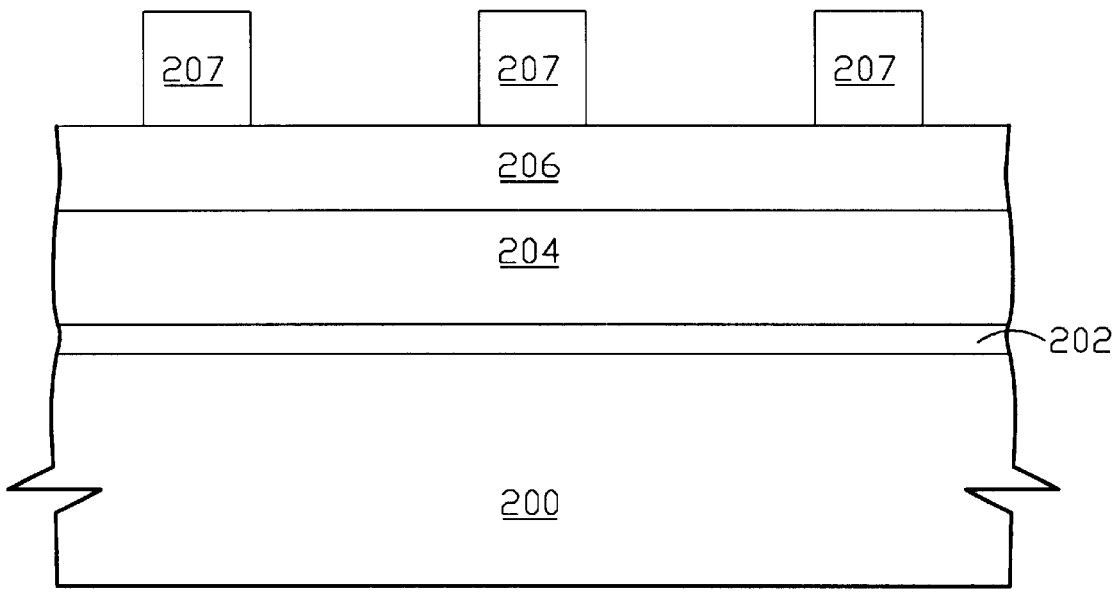
Figure 2C:
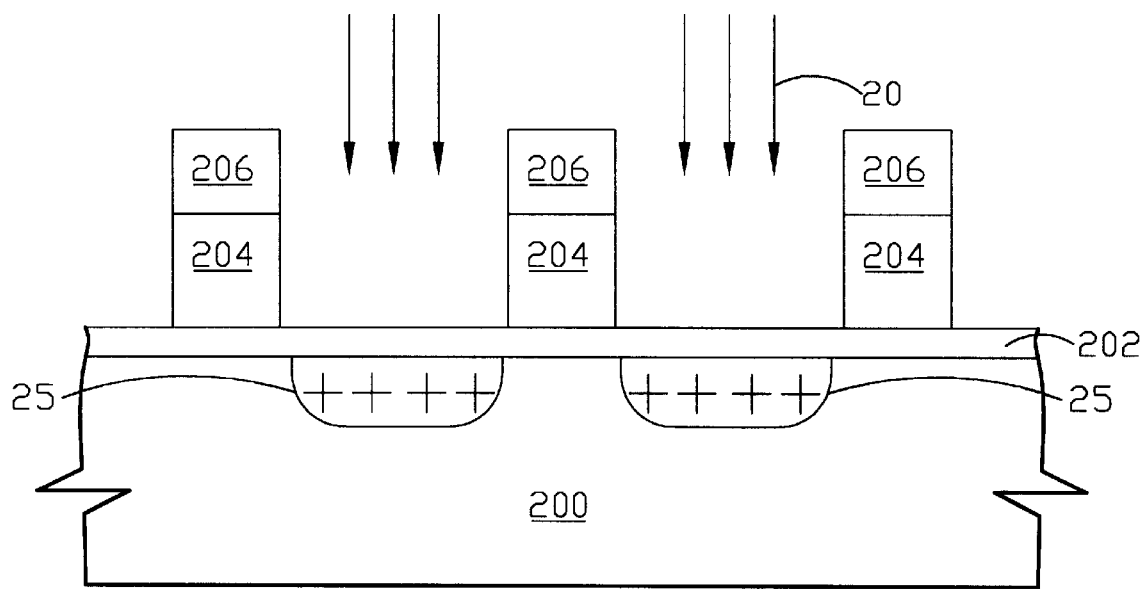

Referring to FIG. 2B and FIG. 2C, a diffusion pattern mask 207 is then placed on the cap layer 206 to define the areas where the active regions of the device will be formed. The exposed regions of the nitride are etched away, using the diffusion pattern mask, to exposed portions of the underlying pad oxide layer 202. Then, the buried $N^+$-type ions 20 are implanted is made with arsenic atoms through the pad oxide layer 202 into the substrate 200 to the form buried $N^+$ region 25. The arsenic ions 20 are implanted at a concentration in a range between about $1\times10^{15}/cm^3$ and about $4\times10^{15}/cm^3$ and an energy level between about 30 Kev and about 50 Kev. In the embodiment, the arsenic ion energy level is preferably 40 Kev.

Figure 2D:
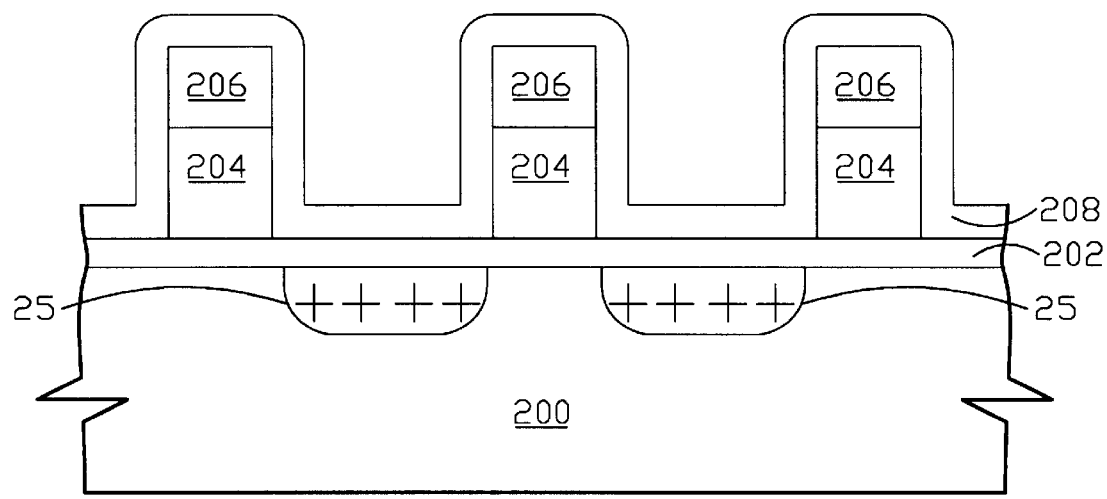

Referring to FIG. 2D, a oxide spacer 208 is deposited on the pad oxide layer 202 and the cap layer 206. The oxide layer 208 comprises silicon dioxide. The oxide spacer 208 is formed by using a low pressure chemical vapor deposition (LPCVD) method or plasma enhance chemical vapor deposition (PECVD) method. In the embodiment, method of this layer 208 is preferably plasma enhance chemical vapor deposition (PECVD) method. The oxide spacer 208 is formed with a thickness between 500 angstroms and 1500 angstroms. In the embodiment, thickness of this layer 208 is preferably 1000 angstroms.

Figure 2E:
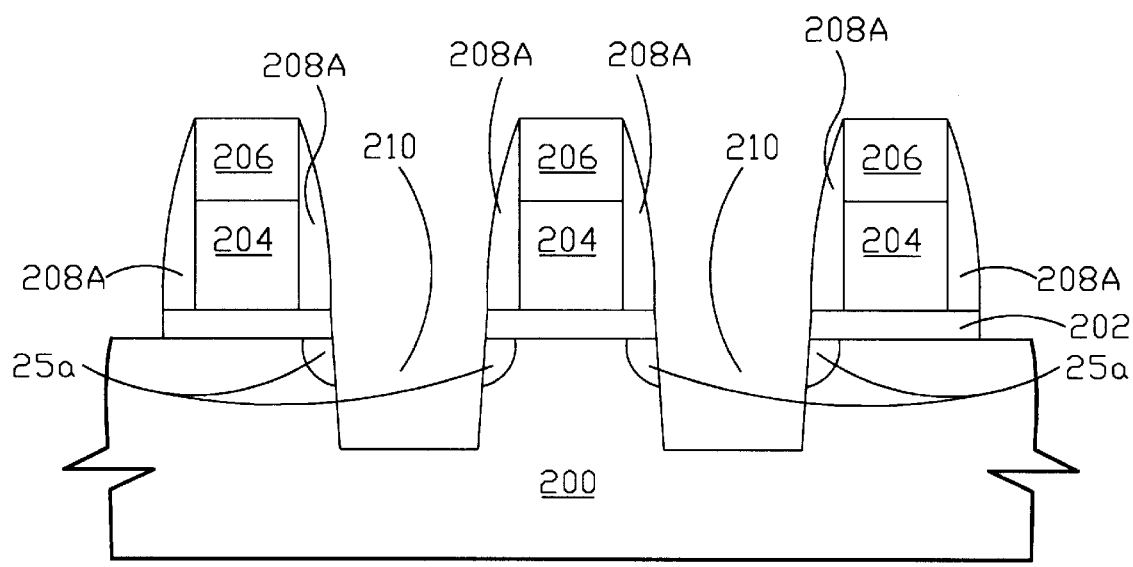

Referring to FIG. 2E, the oxide spacer 208 and the pad oxide layer 202 are etched to stop on the substrate 200 and to form oxide spacer 208A on sidewall of the cap layer 206 and dielectric layer 204. A trench openings 210 is etched by using the cap layer 206 as a mask. The oxide spacer 208A can control the width of the source/drain region. This invention is fabricated symmetric cell and much stable bit/source line resistance. The object of the oxide spacer 208A is to control the width of the source/drain region. Then, a pad oxide layer 202 is etched through the buried $N^+$ region 25 to form a source/drain region 25a and into the substrate 200 to form a trench openings 210. The source/drain region 25a is symmetric cell and more stable bit/source line resistance.

Figure 2F:
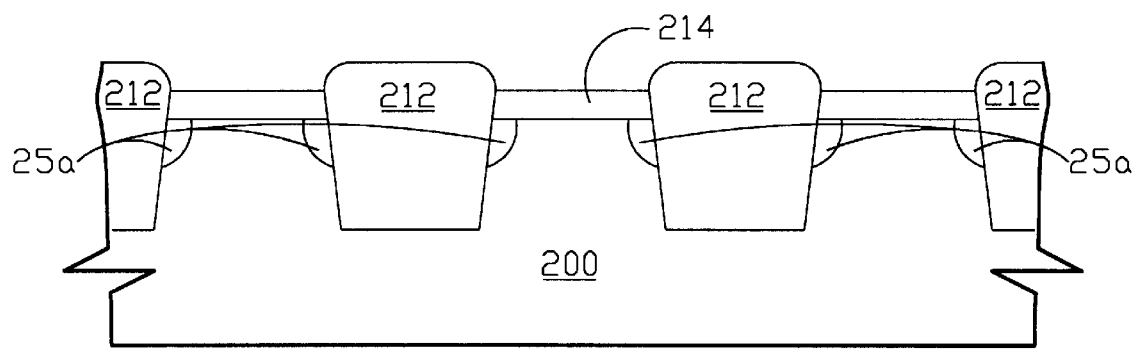

Referring to FIG. 2F, the silicon oxide is filled up in the trench openings 210 to form a shallow trench isolation (STI) 212. The shallow trench isolation (STI) region is planarized by using a chemical mechanical polishing (CMP) method and then the dielectric layer 204 is removed. Then, a tunnel oxide layer 214 is formed over the substrate 200 by, for example, thermal oxidation.

Figure 2G:
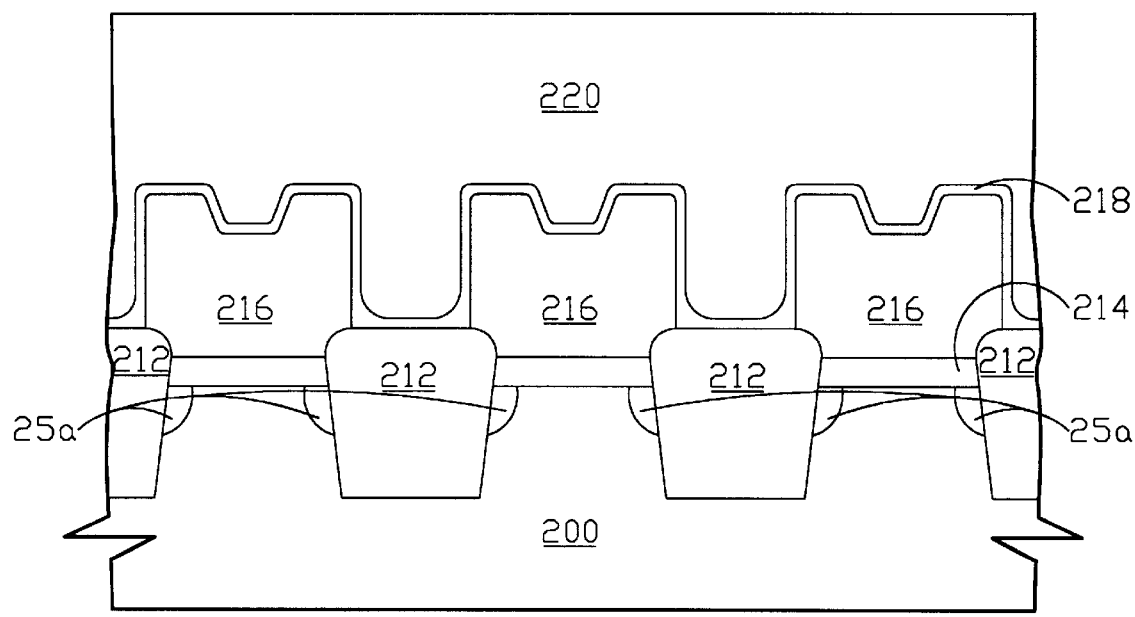

Referring to FIG. 2G, a floating gate 216 is formed between on the shallow trench isolation 212 and active region. Then, a conformal interpoly dielectric layer 218 is formed over the floating gate 216 and the shallow trench isolation 212. The conformal interpoly dielectric layer 218 is often a multilayer insulator such as an oxide-nitride-oxide (ONO) layer having two oxide layers sandwiching a nitride layer. Then, a polysilicon layer 220 is deposited over the interpoly dielectric layer 218 as a control gate to form the gate structure of flash cell array. The control gate 220 is separated therefrom by the conformal interpoly dielectric layer 218. The control gate 220 and the conformal interpoly dielectric layer 218 form a stacked-gate structure. The conformal interpoly dielectric layer 218 includes a first silicon oxide layer, a silicon nitride layer overlies first silicon oxide layer and a second silicon oxide layer (or top oxide layer) overlies silicon nitride layer.

This present invention provides a method for forming the self-aligned buried $N^+$ type to diffusion process in ETOX flash cell. First of all, a substrate is provided having a pad oxide layer thereon, a dielectric layer on the pad oxide layer, and a cap layer on the dielectric layer. Then, a portion of the cap layer and the dielectric layer are etched to stop on the pad oxide layer to define an active region. Then, a spacer is formed on sidewall of the dielectric layer. Next, a portion of the pad oxide layer and the substrate are etched through said buried $N^+$-type region to form an opening in the substrate. Finally, a field oxide region is formed in the substrate.

The method for forming the self-aligned buried $N^+$-type to diffusion process in ETOX flash cell using the above-explained method has the following advantage:

The present invention is to provide a method for forming the self-aligned buried $N^+$-type to diffusion process in ETOX flash cell and also to fabricate symmetric cell for ETOX flash cell operation.

The present invention is to provide a method for forming the self-aligned buried $N^+$-type to diffusion process in ETOX flash cell to stable bit/source line resistance.

While this invention has been described with reference to illustrative embodiments, this description is not intended or to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a self-aligned buried $N^+$ type region in a substrate, said method comprising:

providing a substrate having a pad oxide layer thereon, a dielectric layer on said pad oxide layer, and a cap layer on said dielectric layer;

etching a portion of said cap layer and said dielectric layer to stop on said pad oxide layer to define an active region;

forming a spacer on sidewall of said dielectric layer;

etching a portion of said pad oxide layer and said substrate through said buried $N^+$ type region to form a opening in said substrate; and forming a field oxide region in said substrate.

2. The method for forming a self-aligned buried $N^+$ type region in a substrate according to claim 1, wherein said step of forming said spacer comprises:

depositing a conformal oxide layer over said pad oxide layer and said cap layer; and etching said conformal oxide layer to form a spacer on sidewall of said dielectric layer.

3. The method for forming a self-aligned buried $N^+$ type region in a substrate according to claim 2, wherein said step of etching said conformal oxide layer is performed by an anisotropically etching process.

4. The method for forming a self-aligned buried $N^+$ type region in a substrate according to claim 3, wherein material of said conformal oxide layer is silicon dioxide.

5. The method for forming a self-aligned buried $N^+$ type region in a substrate according to claim 1, wherein material of said cap layer is silicon oxide.

6. The method for forming a self-aligned buried $N^+$ type region in a substrate according to claim 1, wherein said ion implantation is arsenic ions.

7. The method for forming a self-aligned buried N+ type region in a substrate according to claim 1, further comprising a self aligned source process.

8. A method for forming a non-volatile memory array, said method comprising:

providing a substrate having a pad oxide layer thereon, a dielectric layer on said pad oxide layer, and a cap layer on said dielectric layer;

anisotropically etching a portion of said cap layer and said dielectric layer to stop on said pad oxide layer to define an active region;

forming a spacer on sidewall of said dielectric layer;

etching a portion of said pad oxide layer and said substrate through said buried N+-type region to form a opening in said substrate;

forming a field oxide region in said substrate;

forming a floating gate between on said field oxide region and said active region;

forming a conformal interpoly dielectric layer over said floating gate and said field oxide region; and depositing a polysilicon layer over said conformal interpoly dielectric layer as a control gate to form a gate structure of flash cell array.

9. The method for forming a non-volatile memory according to claim 8, wherein said step of forming said spacer comprises:

depositing a conformal oxide layer over said pad oxide layer and said cap layer; and anisotropically etching said conformal oxide layer to form a spacer on sidewall of said cap layer and said dielectric layer.

10. The method for forming a non-volatile memory array according to claim 9, wherein material of said conformal oxide layer is silicon dioxide.

11. The method for forming a non-volatile memory array according to claim 8, wherein material of said cap layer is silicon oxide.

12. The method for forming a non-volatile memory array according to claim 8, wherein said ion is arsenic ion.

13. The method for forming a non-volatile memory array according to claim 8, further comprising a self aligned source process.

14. A method for forming the self-aligned buried N+-type to diffusion process in electron tunnel oxide (ETOX) flash cell, said method comprising:

providing a substrate;

forming a pad oxide layer on said substrate;

forming a dielectric layer on said pad oxide layer;

forming a cap layer on said dielectric layer;

anisotropically etching a portion of said cap layer and said dielectric layer to stop on said pad oxide layer to define an active region;

forming a oxide spacer on sidewall of said dielectric layer;

anisotropically etching a portion of said pad oxide layer and said substrate to form a opening in said substrate;

forming a field oxide region in said substrate;

forming a floating gate between on said field oxide region and said active region;

forming a conformal interpoly dielectric layer over said floating gate and said field oxide region; and depositing a polysilicon layer over said conformal interpoly dielectric layer as a control gate to form a gate structure of flash cell array.

15. The method for forming the self-aligned buried N+-type to diffusion process in electron tunnel oxide (ETOX) flash cell according to claim 14, wherein material of said cap layer is silicon nitride.

16. The method for forming the self-aligned buried N+-type to diffusion process in electron tunnel oxide (ETOX) flash cell according to claim 14, wherein said field oxide region is a shallow trench isolation.

17. The method for forming the self-aligned buried N+-type to diffusion process in electron tunnel oxide (ETOX) flash cell according to claim 14, further comprising a self aligned source process.

* * * * *